(12) United States Patent
He et al.

(10) Patent No.: US 11,921,169 B2
(45) Date of Patent: Mar. 5, 2024

(54) TRANSFORMER FAULT DIAGNOSIS METHOD AND SYSTEM USING INDUCED ORDERED WEIGHTED EVIDENCE REASONING

(71) Applicant: WUHAN UNIVERSITY, Hubei (CN)

(72) Inventors: Yigang He, Hubei (CN); Jiajun Duan, Hubei (CN); Xiaoxin Wu, Hubei (CN); Liulu He, Hubei (CN)

(73) Assignee: WUHAN UNIVERSITY, Hubei (CN)

( * ) Notice: Subject to any disclaimer, the term of this patent is extended or adjusted under 35 U.S.C. 154(b) by 22 days.

(21) Appl. No.: 17/496,779

(22) Filed: Oct. 8, 2021

(65) Prior Publication Data

US 2022/0196760 A1 Jun. 23, 2022

(30) Foreign Application Priority Data

Dec. 18, 2020 (CN) .......................... 202011501739.2

(51) Int. Cl.
*G01R 31/62* (2020.01)
*G06N 7/01* (2023.01)

(52) U.S. Cl.
CPC .............. *G01R 31/62* (2020.01); *G06N 7/01* (2023.01)

(58) Field of Classification Search
CPC .......... G01R 31/62; G06N 7/01; G06N 5/048
See application file for complete search history.

(56) References Cited

U.S. PATENT DOCUMENTS

2020/0387785 A1* 12/2020 He .......................... G06N 5/043

OTHER PUBLICATIONS

Yao et al. "induced Ordered Weighted Evidential Reasoning Approach for Multiple Attribute Decision Analysis with uncertainty", International Journal of Intelligent Systems, vol. 29, 906-925 (2014). (Year: 2014).*

Yager et al. "Induced Ordered Weighted Averaging Operators", IEEE Transactions on System, Man and Cybernetics—Part B: Cybernetics, vol. 29, No. 2, Apr. 1999 (Year: 1999).*

Duan et al. "Fault localization on transformer winding by frequency response analysis and evidential reasoning", 7th International Symposium on Test Automation and Instrumentation (ISTAI 2018), IET Journals, The institute of Engineering and Technology (Year: 2018).*

(Continued)

*Primary Examiner* — Farhana A Hoque
*Assistant Examiner* — Dilara Sultana
(74) *Attorney, Agent, or Firm* — JCIPRNET (57) ABSTRACT

A transformer fault diagnosis method and system using induced ordered weighted evidence reasoning is provided. The method includes the following steps. A typical data sample of transformer sweep frequency response analysis is loaded and a diagnostic label is set as an identification framework. Test data of a device to be diagnosed is loaded. Basic probability assignment is calculated and a reliability decision matrix is constructed. An induced ordered weighted averaging operator and its induction vector are calculated according to a sample source of the data. An index weight vector is calculated. All evidence is fused by the induced ordered weighted evidence theory and reliability of comprehensive evaluation is calculated, so as to determine a diagnosis result. The disclosure realizes fault identification, fault type distinction and fault position of power equipment by interpreting detection waveforms.

15 Claims, 2 Drawing Sheets

(56) References Cited

OTHER PUBLICATIONS

Tang et al. "An Improved Evidential-Iowa Sensor Data Fusion Approach in Fault diagnosis", Sensors, 17, 2143, 2017 (Year: 2017).*
Liu et al. "Fuzzy Failure Mode and Effects Analysis Using Fuzzy Evidential Reasoning and Belief Rule-Based Methodology", IEEE Transactions on Reliability, vol. 62, No. 1, Mar. 2013 (Year: 2013).*
A. W.H. Tang et al. "Relative Condition Ranking of Transformers Using Evidence Theory", 2004 International Conference on Power System Technology—Powercon 2004 Singapore, Nov. 21-24, 2004. (Year: 2004).*
B. Liao et al., "An Integrated Decision-Making Model for Condition Assessment of Power Transformers Using Fuzzy Approach and Evidential Reasoning", IEEE Transactions on Power Delivery, vol. 26, No. 2, Apr. 2011 (Year: 2011).*

\* cited by examiner

TRANSFORMER FAULT DIAGNOSIS METHOD AND SYSTEM USING INDUCED ORDERED WEIGHTED EVIDENCE REASONING

CROSS-REFERENCE TO RELATED APPLICATION

This application claims the priority benefit of China application serial no. 202011501739.2, filed on Dec. 18, 2020. The entirety of the above-mentioned patent application is hereby incorporated by reference herein and made a part of this specification.

BACKGROUND

Technical Field

This disclosure belongs to the field of transformer fault diagnosis, and in particular, relates to a fault diagnosis method and system that applies a multi-source information fusion theory of induced ordered weighted evidence reasoning to a transformer FRA.

Description of Related Art

A power transformer is one of the most important devices in a power system. It has a complex structure and faces various types of dangers in actual operation, in which damage due to a winding mechanical fault is the most common cause of a power transformer fault. Specifically, the action of short-circuit current and electromagnetic force may cause mechanical axial/radial displacement deformation. The most widely used method in mechanical fault detection is Frequency Response Analysis (FRA), in which a transfer function of the transformer is obtained and compared to a standard value of the device, so as to identify the fault. However, the comparison process and interpretation of results depend on judgment of an expert, which is based on experience, and there is no unified fault identification standard currently. A difference between expert experience and research expertise may lead to inaccurate analysis results, which is a common shortcoming based on the FRA method. A common method is to calculate statistical indicators of a sweep frequency response curve through research and set a certain range of device health thresholds. However, this method has poor adaptability, and the set indicators are only applicable to a specific device. Current research also tries to adopt machine learning classification algorithms to implement fault identification of the sweep frequency response curve, but this method requires large amount of data, which may be difficult to implement in some practical scenarios.

SUMMARY

This disclosure provides a transformer fault diagnosis method and system using induced ordered weighted evidence reasoning, which improves degree of intelligence and diagnosis accuracy of the power device fault diagnosis method, and may be applicable to situations with incomplete data information, lack of faulty samples, and diversified sample source reliability.

According to an aspect of the disclosure, a transformer fault diagnosis method using induced ordered weighted evidence reasoning is provided, which includes the following steps.

(1) A typical data sample of a transformer FRA is loaded, and a diagnostic label is set as an identification framework.

(2) Test data of a device to be diagnosed is loaded.

(3) Basic probability assignments of a detection data curve of the device to be diagnosed are calculated and all characteristic data curves in the identification framework are calculated, and a reliability decision matrix is constructed.

(4) An induced ordered weighted averaging operator and its induction vector are calculated according to a sample source of the test data of the device to be diagnosed.

(5) An index weight vector is calculated.

(6) All evidence is fused by the induced ordered weighted evidence theory and reliability of comprehensive evaluation is calculated, so as to determine a diagnosis result.

In some embodiments, the typical data sample of the transformer FRA loaded in the Step (1) includes the following types. An actual test sample, for example, historical test data of the device or manufacturer test data, and this data sample type is the most accurate reference data. A sample of a device of the same model, for example, test data of another device of the same model, and this data is a more accurate reference data. An accurate simulation sample, such as a sample of various labels that is obtained after a detailed simulation model is established for the device.

And, a fast simulation sample, such as a sample of various labels that are obtained through simulation after a simplified model is established for the device while taking into consideration various limitations, such as hardware and timeliness.

In some embodiments, in the Step (1), the specific method for setting the diagnostic label as the identification framework includes the following. In a first stage of diagnosis, the data to be tested is first divided into two types of diagnosis: healthy and unhealthy, thus, the identification framework is $\Theta=\{healthy, unhealthy\}$, or the data to be tested is divided into different health levels. When the diagnosis result is that the data to be tested is in an unhealthy state and a fault type has to be further detected, at this time, a second stage of diagnosis is entered, where the fault type is $F_i$ (i=1, 2, ...), and the identification framework is set to $\Theta=\{F_1, F_2, \ldots, F_i, \ldots\}$. Similarly, when the diagnosis result is that the data to be tested is in the unhealthy state and a fault location has to be further detected, at this time, a third stage of diagnosis is entered, where the fault location is $L_j$ (j=1, 2, ...), and the identification framework is set to $\Theta=\{L_1, L_2, \ldots, L_j, \ldots\}$. To ensure a unified description, all elements in the identification framework are marked as $\Theta=\{H_1, H_2, \ldots, H_l, \ldots H_N\}$, where l represents the number of a subset in the identification framework, and N represents the number of all subsets in the identification framework.

In some embodiments, in the Step (3), the specific method for calculating the basic probability assignments of the detection data curve of the device to be diagnosed and all the characteristic data curves in the identification framework includes the following steps.

The detection data curve $\overline{X}_0$ of the device to be diagnosed and the characteristic data curve $\overline{X}_l$ in the identification framework are divided into $N_{SEC}$ segments in the same manner, with $\overline{X}_0=[X_{01}, X_{02}, \ldots X_{0k}, \ldots, X_{0N_{SEC}}]$, $\overline{X}_l=[X_{l1}, X_{l2}, \ldots, X_{lk}, \ldots X_{lN_{SEC}}]$, where $X_{0k}$ represents a k-th segment after division of $\overline{X}_0$, $X_{lk}$ represents a k-th segment after division of an l-th curve $\overline{X}_l$ in the identification framework, where k=1, 2, ... $N_{SEC}$.

A distance $P_{k,l}$ between each segment of the detection data curve of the device to be diagnosed and all the characteristic data curves in the identification framework are calculated through a curve similarity algorithm, and the distance of each curve is converted into a reliability $\beta_{k,l}$.

In some embodiments, in the Step (3), the specific method for constructing the reliability decision matrix includes the following steps.

A distribution assessment vector S is defined as $S(X_k(A_t))=\{(H_l, \beta_{k,l}(A_t)), l=1, \ldots, N\}$, which means that an attribute $X_k$ of an evaluated object $A_t$ is assessed to be at a level $H_l$, with the reliability of $\beta_{k,l}$, then an evaluation result of $N_{SEC}$ basic attributes of T evaluated objects ($t=1, 2, \ldots, T$) may be expressed as a reliability decision matrix: $D_g=(S(X_k(A_t)))_{N_{SEC} \times T}$, where $X_k$ represents a k-th segment curve corresponding to the evaluated object $A_t$ after division.

In some embodiments, in the Step (4), the specific method for calculating the induced ordered weighted averaging operator and its induction vector includes the following steps.

An induced variable $u_k$ of the device to be diagnosed is determined, and values are assigned to the induced variable based on the data preliminarily calculated in the previous steps.

An ordered weighted averaging operator F is defined to satisfy $$F(\langle u_1, a_1\rangle, \ldots, \langle u_{N_{SEC}}, a_{N_{SEC}}\rangle) = \sum_{k=1}^{N_{SEC}} \omega_k b_k,$$

where $\omega=(\omega_1, \omega_2, \ldots, \omega_k, \ldots, \omega_{N_{SEC}})$ is a weighted vector, $$\omega_k \in [0, 1], \sum_{k=1}^{N_{SEC}} \omega_k = 1.$$

$\langle u_k, a_k\rangle$ is called an OWA pair, $b_k$ is a k-th element in $\{u_1, u_2, \ldots, u_{N_{SEC}}\}$ when arranged in an descending order/ascending order that corresponds to a second component $a_k$ in the OWA pair, and a first component $u_k$ in $\langle u_k, a_k\rangle$ is called an induced component, and a second component $a_k$ is a numerical component. When $u_{k1}=u_{k2}$, then $a_{k1}$ and $a_{k2}$ is divided equally during an assembly process of the OWA pair:

$$\left\langle u_{k1}, \frac{1}{2}(a_{k1}+a_{k2})\right\rangle,$$

$$\left\langle u_{k2}, \frac{1}{2}(a_{k1}+a_{k2})\right\rangle,$$

where k1 and k2 represent two different values of k, $u_{k1}$ and $u_{k2}$ represent two different values of $u_k$, and $a_{k1}$ and $a_{k2}$ represent numerical components of $a_k$.

In some embodiments, in the Step (5), the specific method for calculating the index weight vector includes the following steps.

Different weights $\omega'=(\omega'_1, \omega'_2, \ldots, \omega'_k, \ldots, \omega'_{N_{SEC}})$ are obtained by division using equal assignment according to the attribute $X_k$, where $$\omega'_1 = \omega'_2 = \ldots = \omega'_k = \ldots = \omega'_{N_{SEC}} = \frac{1}{N_{SEC}}.$$

Or, respective weights $\omega'=(\omega'_1, \omega'_2, \ldots, \omega'_k, \ldots, \omega'_{N_{SEC}})$ are calculated using an objective weight assignment method, and then adjusted according to the induced component, and finally determining the weight values to be $$\begin{cases} \omega = (\omega_1, \omega_2, \cdots, \omega_k, \cdots, \omega_{N_{SEC}}) \\ \omega_k = \dfrac{\omega'_k u_k}{\sum_{k=1}^{N_{SEC}} \omega'_k u_k}, \text{ and } \sum_{k=1}^{N_{SEC}} \omega_k = 1 \end{cases},$$

where the induction vector $u=(u_1, u_2, \ldots, u_k, \ldots, u_{N_{SEC}})$. When a final weight has to be optimized according to the OWA operator F, an objective function is set as $\Gamma(\omega)$, thereby obtaining $$\begin{cases} \min \Gamma(\omega) = \sum_{k=1}^{N_{SEC}} \Gamma(\omega_k) \\ \text{s.t.} \sum_{k=1}^{N_{SEC}} \omega_k = 1 \end{cases},$$

and finally obtaining the weight vector $\omega=(\omega_1, \omega_2, \ldots, \omega_k, \ldots, \omega_{N_{SEC}})$ of each attribute.

In some embodiments, the specific implementation method of the Step (6) includes the following steps.

Information of the different attributes $X_k$ is inputted into the same identification framework $\Theta$, and a basic probability assignment m is calculated:

$$m_{k,l}=m_k(H_l)=\omega_k \beta_{k,l}$$

$$m_{k,H_\Theta}=m_k(H_\Theta)=1-\Sigma_{l=1}^N m_{k,l}=1-\omega_k \Sigma_{l=1}^N \beta_{k,l}$$

$$\tilde{m}_{k,H_\Theta}=\tilde{m}_k(H_\Theta)=\omega_k(1-\Sigma_{l=1}^N \beta_{k,l})$$

$$\overline{m}_{k,H_\Theta}=\overline{m}_k(H_\Theta)=(1-\omega_k)$$

And the probability assignment is compounded:

$$m_l=K[\Pi_{k=1}^{N_{SEC}}(m_{k,l}+\overline{m}_{k,H_\Theta}+\tilde{m}_{k,H_\Theta})-\Pi_{k=1}^{N_{SEC}}(\overline{m}_{k,H_\Theta}+\tilde{m}_{k,H_\Theta})]$$

$$\tilde{m}_{H_\Theta}=K[\Pi_{k=1}^{N_{SEC}}(\overline{m}_{k,H_\Theta}+\tilde{m}_{k,H_\Theta})-\Pi_{k=1}^{N_{SEC}}(\overline{m}_{k,H_\Theta})]$$

$$\overline{m}_{H_\Theta}=K[\Pi_{k=1}^{N_{SEC}}(\overline{m}_{k,H_\Theta})]$$

$$K=[\Sigma_{l=1}^N \Pi_{k=1}^{N_{SEC}}(m_{k,l}+\overline{m}_{k,H_\Theta}+\tilde{m}_{k,H_\Theta})-(N-1)\Pi_{k=1}^{N_{SEC}}(\overline{m}_{k,H_\Theta}+\tilde{m}_{k,H_\Theta})]^{-1}$$

A comprehensive diagnosis result is obtained after normalized processing:

$$\{H_l\}: \beta_l = \frac{m_l}{1-\overline{m}_{H_\Theta}}, l=1, \ldots, N$$

$$\{H_\Theta\}: \beta_\Theta = \frac{\tilde{m}_{H_\Theta}}{1-\overline{m}_{H_\Theta}}, l=1, \ldots, N$$

Therefore, for each state $\Theta=\{H_1, H_2, \ldots, H_l, \ldots, H_N, H_\Theta\}$ of the identification framework, the final diagnosis result is: $\{\beta_1, \beta_2, \ldots, \beta_l, \ldots, \beta_N, \beta_\Theta\}$, where $\beta_\Theta$ represents a degree of uncertainty.

According to another aspect of the disclosure, a transformer fault diagnosis system using induced ordered weighted evidence reasoning is provided, which includes the following.

A pre-processing module, which is configured to load typical data samples of a transformer FRA and set a diagnostic label as an identification framework.

An acquisition of data to be tested module, which is configured to load test data of a device to be diagnosed.

A reliability construction module, which is configured to calculate basic probability assignments of a detection data curve of the device to be diagnosed and all characteristic data curves in the identification framework, and construct a reliability decision matrix.

An induced ordered weighted calculation module, which is configured to calculate an induced ordered weighted averaging operator and its induction vector according to a sample source of the test data of the device to be diagnosed.

A weight calculation module, which is configured to calculate an index weight vector.

A diagnosis module, which is configured to fuse all evidence by the induced ordered weighted evidence theory and calculate reliability of comprehensive evaluation, so as to determine a diagnosis result.

According to another aspect of the disclosure, a computer-readable storage medium is provided, which has a computer program stored thereon. When the computer program is executed by a processor, the steps of any one of the above-mentioned methods are realized.

In general, compared to the related art, the above technical solutions conceived by the disclosure may achieve the following.

The disclosure applies the multi-source information fusion theory to the fault diagnosis of the sweep frequency response analysis, and combines objectivity of the index analysis method and adaptability of the artificial intelligence evidence theory. Different scene information is considered through the induced ordered weighted (IOW) factors, thereby realizing optimization of weights and flexible adjustment of focus of diagnosis, thereby improving pertinence of the diagnosis result. In addition, there are often missing data or incomplete sample types during an actual diagnosis process. The evidence reasoning theory is able to deal with incomplete information by realizing processing of incomplete information through introduction of "uncertain" states or fuzzy state intervals.

DESCRIPTION OF THE EMBODIMENTS

In order to enhance comprehension of the objectives, technical solutions, and advantages of the disclosure, the disclosure is further described in detail as follows with reference to accompanying drawings and embodiments. It should be understood that the specific embodiments described here are only used to explain the disclosure, and are not meant to limit the disclosure. In addition, the technical features involved in the various embodiments of the disclosure described below may be combined with each other as long as they are not in conflict with each other.

Evidence theory method is a kind of reasoning theory that may express uncertainty. It is usually configured to fuse uncertain information from multiple sources, such as multiple sensors and opinions of experts, thereby improving accuracy of information from a single source. The disclosure applies the multi-source information fusion theory to fault diagnosis of sweep frequency response analysis, combines objectivity of the index analysis method and adaptability of the artificial intelligence reasoning theory, and is applicable to scenarios containing uncertain information. This is because there are often missing data or incomplete sample types during an actual diagnosis process. In addition, the disclosure may flexibly adjust focus of diagnosis and improve pertinence of the diagnosis result through introduction of the induced ordered weighted factor.

Figure 1:
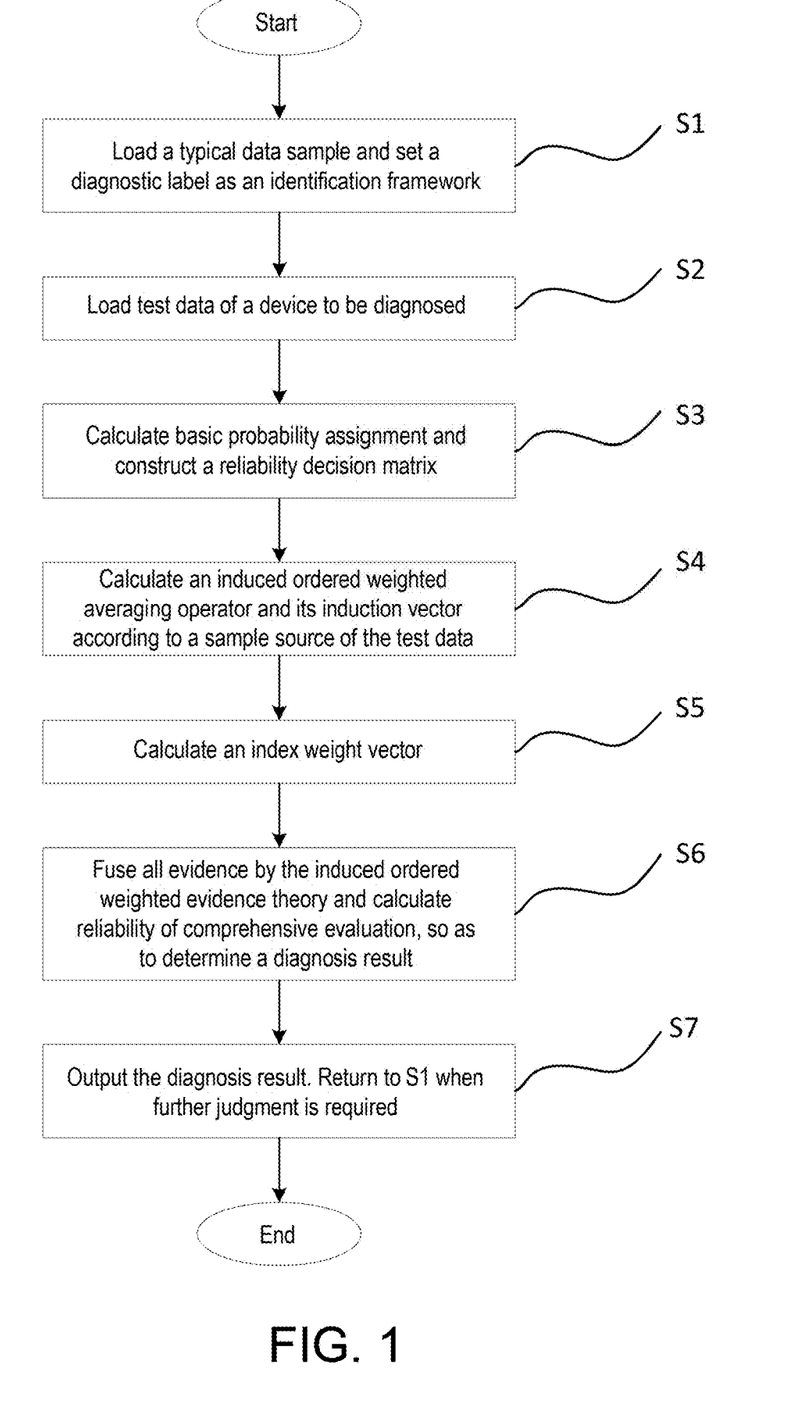
FIG. 1 is a schematic flowchart of a transformer fault diagnosis method based on induced ordered weighted evidence reasoning according to an embodiment of the disclosure.

FIG. 1 is a schematic flowchart of a transformer fault diagnosis method using induced ordered weighted evidence reasoning according to an embodiment of the disclosure. The method shown in FIG. 1 includes the following steps.

S1: A typical data sample of a transformer FRA is loaded, and a diagnostic label is set as an identification framework.

S2: Test data of a device to be diagnosed is loaded.

S3: Basic probability assignment (BPA) of the detection data curve of the device to be diagnosed and all characteristic data curves in the identification framework are calculated, and a reliability decision matrix is constructed.

S4: An induced ordered weighted averaging operator and its induction vector are calculated according to a sample source (a constructible indicator such as device source, time, a correction factor) of the test data of the device to be diagnosed.

S5: An index weight vector is calculated.

S6: All evidence is fused by the induced ordered weighted evidence theory and reliability of comprehensive evaluation is calculated, so as to determine a diagnosis result.

S7: The detection framework is adjusted and return to the Step S1 when further judgment is required.

Furthermore, the typical data sample loaded in the Step S1 includes the following types. a) An actual test sample, for example, historical test data of the device or manufacturer test data, and this data sample type is the most accurate reference data. b) A sample of a device of the same model, for example, test data of another device of the same model, and this data is a more accurate reference data. c) An accurate simulation sample, such as a sample of various labels that is obtained after a detailed simulation model is established for the device. d) A fast simulation sample, such as a sample of various labels that are obtained through simulation after a simplified model is established for the device while taking into consideration various limitations, such as hardware and timeliness.

In which, when there are multiple data with the same label, the data with the highest reliability is generally selected.

Furthermore, the specific method for setting the diagnostic label as the identification framework in the Step S1 includes the following steps. In a first stage of diagnosis, the data to be tested is first divided into two types of diagnosis: healthy and unhealthy, thus, the identification framework is $\Theta=\{healthy, unhealthy\}$, or the data to be tested is divided into different health levels. When the diagnosis result is that the data to be tested is in an unhealthy state and a fault type has to be further detected, one has to return to the Step S1, which is a second stage of diagnosis, and the fault type is $F_i$ (i=1, 2, . . . ), then the identification framework is set to $\Theta=\{F_1, F_2, \ldots, F_i, \ldots\}$. Similarly, when the diagnosis result is that the data to be tested is in the unhealthy state and a fault location has to be further detected, one has to return to the Step S1, which is a third stage of diagnosis, and the fault location is $L_j$ (j=1, 2, ...), and the identification framework is set to $\Theta=\{L_1, L_2, \ldots, L_j, \ldots\}$.

To ensure a unified description, all elements in the identification framework are marked as $\Theta=\{H_1, H_2, \ldots, H_l, \ldots, H_N\}$, where l represents the number of a subset in the identification framework, and N represents the number of all subsets in the identification framework. For the first stage of diagnosis, l=1 or 2, $H_1$=healthy, $H_2$=unhealthy, N=2. For the second stage of diagnosis, l is the fault type i, having l=i. For the third stage of diagnosis, l is the fault location j, having l=j.

In which, in an actual application, it may not be necessary to distinguish the fault type, and only fault positioning is required, then at this time, the fault location detection process belongs to the second stage of diagnosis.

Furthermore, the step of calculating the basic probability assignment in the Step S3 includes the following.

S3.1: First, a detection data curve $\overline{X}_0$ of the device to be diagnosed and a comparison curve $\overline{X}_1$ in the identification framework are divided into $N_{SEC}$ segments in the same manner, with $\overline{X}_0=[X_{01}, X_{02}, \ldots, X_{0k}, \ldots, X_{0N_{SEC}}]$, $\overline{X}_l=[X_{l1}, X_{l2}, \ldots, X_{lk}, \ldots, X_{lN_{SEC}}]$, $X_{0k}$ represents a k-th segment after division of $\overline{X}_0$, $X_{lk}$ represents a k-th segment after division of an l-th curve $\overline{X}_l$ in the identification framework.

In which, for multiple curves that belong to the same element in the recognition framework, the curve with data source that has higher reliability is selected as the research object.

S3.2: A distance $P_{k,l}$ between each segment of the detection data curve of the device to be diagnosed and all the characteristic data curves in the identification framework are calculated through a curve similarity algorithm (such as Euclidean distance, dynamic time warping, Fréchet distance, or locality in-between polylines).

S3.3: The distance of each curve is converted into a reliability $\beta_{k,l}$.

In which, a distance-reliability conversion formula can have various manners, such as ①

$$\beta_{k,l} = (P_{k,l})^{-1} \Big/ \sum_{l=1}^{N} (P_{k,l})^{-1},$$

② softmax formula $$\beta_{k,l} = (e^{P_{k,l}})^{-1} \Big/ \sum_{l=1}^{N} (e^{P_{k,l}})^{-1},$$

which has to satisfies $$\sum_{l=1}^{N} \beta_{k,l} = 1.$$

For example, assuming that for a certain curve $X_k$, the detection framework is $\Theta=\{H_1, H_2, \ldots, H_l, \ldots, H_N\}=\{$fault 1, fault 2, fault 3$\}$, then at this time l=i=1, 2, 3, N=3. When the curve distance $P_{k,1}=12$, $P_{k,2}=8.8$, $P_{k,3}=14.2$, $[\beta_{k,1}, \beta_{k,2}, \beta_{k,3}]=[0.312, 0.425, 0.263]$ is obtained according to the distance-reliability conversion formula ①, and $[\beta_{k,1}, \beta_{k,2}, \beta_{k,3}]=[0.039, 0.957, 0.004]$ is obtained according to the formula of ② softmax. Both satisfy the requirements of $\beta_{k,1}+\beta_{k,2}+\beta_{k,3}=1$ and a difference between ① and ② lies in their sensitivity to deviation.

Furthermore, the method for constructing the reliability decision matrix in the Step S3 includes the following.

A distribution assessment vector S is defined as $S(X_k(A_t))=\{(H_l, \beta_{k,l}(A_t)), l=1, \ldots, N\}$, which means that an attribute $X_k$ (represents a k-th segment after curve division) of an evaluated object $A_t$ is assessed to be at a level $H_l$, with a reliability of $\beta_{k,l}$ (basic probability assignments). Then an evaluation result of $N_{SEC}$ basic attributes of T evaluated objects (t=1, 2, ..., T) may be expressed as a reliability decision matrix: $D_g=(S(X_k(A_t)))_{N_{SEC} \times T}$. Under normal circumstances, there is only one object to be evaluated and at this time, $S(X_k)=\{(H_l, \beta_{k,l}), l=1, \ldots, N\}$, $D_g=(S(X_k))_{N_{SEC} \times 1}$, and since S is a vector, it may be expanded into a single line, that is $D_g=(S(X_k))_{N_{SEC} \times N}$.

In which, the evaluated object $A_t$ generally represents detection time (that is, a detection cycle). The diagnosis process is dynamic when the detection time is not unique. In addition, a missing state value is expressed as an interval, such as $([H_2, H_3], 1)$ when there is incomplete information due to missing data, detection faults, wrong information, etc.

Furthermore, the method for calculating the induced ordered weighted averaging operator in the Step S4 includes the following.

S4.1: An induced variable $u_k$ of the device to be diagnosed is determined first, which is usually data obtained through preliminary calculation of the above steps, and values are assigned to the induced variable according to the data.

In which, a specific definition method of the induced variable $u_k$ is determined according to actual diagnosis requirements. For example, when the emphasis is on device degradation information, an induced vector may be set as a health level of the diagnosis, in which the more unhealthy the device, the higher an induced component. When a certain type of fault has to be emphasized, support of the fault type is set as the induced component, and the induced component with higher support for this type of fault is also larger.

S4.2: An ordered weighted averaging (OWA) operator is calculated, and an OWA operator F is defined to satisfy $$F(\langle u_1, a_1 \rangle, \ldots, \langle u_{N_{SEC}}, a_{N_{SEC}} \rangle) = \sum_{k=1}^{N_{SEC}} \omega_k b_k,$$

where $\omega=(\omega_1, \omega_2, \ldots, \omega_k, \ldots, \omega_{N_{SEC}})$ is a weighted vector, $$\omega_k \in [0, 1], \sum_{k=1}^{N_{SEC}} \omega_k = 1.$$

$\langle u_k, a_k \rangle$ is called an OWA pair, $b_k$ is a k-th element in $\{u_1, u_2, \ldots, u_{N_{SEC}}\}$ when arranged in an descending order/ascending order that corresponds to a second component $a_k$ in the OWA pair, and a first component $u_k$ in $\langle u_k, a_k \rangle$ is called an induced component, and a second component $a_k$ is a numerical component. For example, the inductive component $u_k$ is set as the reliability $\beta_{k,l}$ of a fault type 1 (that is, $H_1$), and a corresponding numerical component is reliability value $\beta_{k,l}$ of all fault types. When $u_{k1}=u_{k2}$, then $a_{k1}$ and $a_{k2}$ is divided equally during an assembly process of the OWA pair:

$$\left\{u_{k1}, \frac{1}{2}(a_{k1}+a_{k2})\right\}, \left\{u_{k1}, \frac{1}{2}(a_{k1}+a_{k2})\right\},$$

where k1 and k2 represent two different values of k, $u_{k1}$ and $u_{k2}$ represent two different values of $u_k$, and $a_{k1}$ and $a_{k2}$ represent their numerical components.

Furthermore, the calculation method of the index weight vector in the Step S5 includes the following. In general, different weights $\omega'=(\omega'_1, \omega'_2, \ldots, \omega'_k, \ldots, \omega'_{N_{SEC}})$ are obtained by division using equal assignment according to the attribute $X_k$, where $$\omega'_1 = \omega'_2 = \ldots = \omega'_k = \ldots = \omega'_{N_{SEC}} = \frac{1}{N_{SEC}}.$$

Or, respective weights $\omega'=(\omega'_1, \omega'_2, \ldots, \omega'_k, \ldots, \omega'_{N_{SEC}})$ are calculated using an objective weight assignment method, such as an analytic hierarchy process, the Delphi method, the information entropy method, or the rough sets method, and then adjust them according to the induced component, and finally determine the weight values. For example, an induction vector $u=(u_1, u_2, \ldots, u_k, \ldots, u_{N_{SEC}})$, then $$\begin{cases} \omega = (\omega_1, \omega_2, \cdots, \omega_k, \cdots, \omega_{N_{SEC}}) \\ \omega_k = \frac{\omega'_k u_k}{\sum_{k=1}^{N_{SEC}} \omega'_k u_k}, \text{ and } \sum_{k=1}^{N_{SEC}} \omega_k = 1 \end{cases}.$$

When a final weight has to be optimized according to the OWA operator F, an objective function is set as $\Gamma(\omega)$, then $$\begin{cases} \min \Gamma(\omega) = \sum_{k=1}^{N_{SEC}} \Gamma(\omega_k) \\ \text{s.t.} \sum_{k=1}^{N_{SEC}} \omega_k = 1 \end{cases},$$

and finally obtaining the weight vector $\omega=(\omega_1, \omega_2, \ldots, \omega_k, \ldots, \omega_{N_{SEC}})$ of each attribute.

Furthermore, the method for calculating the diagnosis result through fusion of evidence in the Step S6 includes the following.

S6.1: Information of the different attributes $X_k$ is inputted into the same identification framework $\Theta$, and a basic probability assignment m is calculated:

$$m_{k,l}=m_k(H_l)=\omega_k \beta_{k,l}$$

$$m_{k,H_\Theta}=m_k(H_\Theta)=1-\Sigma_{l=1}^N m_{k,l}=1-\omega_k \Sigma_{l=1}^N \beta_{k,l}$$

$$\tilde{m}_{k,H_\Theta}=\tilde{m}_k(H_\Theta)=\omega_k(1-\Sigma_{l=1}^N \beta_{k,l})$$

$$\overline{m}_{k,H_\Theta}=\overline{m}_k(H_\Theta)=(1-\omega_k)$$

S6.2: The probability assignment is compounded:

$$m_l=K[\Pi_{k=1}^{NSEC}(m_{k,l}+\overline{m}_{k,H_\Theta}+\tilde{m}_{k,H_\Theta})-\Pi_{k=1}^{NSEC}(\overline{m}_{k,H_\Theta}+\tilde{m}_{k,H_\Theta})]$$

$$\tilde{m}_{H_\Theta}=K[\Pi_{k=1}^{NSEC}(\overline{m}_{k,H_\Theta}+\tilde{m}_{k,H_\Theta})-\Pi_{k=1}^{NSEC}(\overline{m}_{k,H_\Theta})]$$

$$\overline{m}_{H_\Theta}=K[\Pi_{k=1}^{NSEC}(\overline{m}_{k,H_\Theta})]$$

$$K=[\Sigma_{l=1}^N \Pi_{k=1}^{NSEC}(m_{k,l}+\overline{m}_{k,H_\Theta}+\tilde{m}_{k,H_\Theta})-(N-1)\Pi_{k=1}^{NSEC}(\overline{m}_{k,H_\Theta}+\tilde{m}_{k,H_\Theta})]^{-1}$$

S6.3: A comprehensive diagnosis result is obtained after normalized processing:

$$\{H_l\}: \beta_l = \frac{m_l}{1-\overline{m}_{H_\Theta}}, l=1, \ldots, N$$

$$\{H_\Theta\}: \beta_\Theta = \frac{\tilde{m}_{H_\Theta}}{1-\overline{m}_{H_\Theta}}, l=1, \ldots, N$$

Therefore, for each state $\Theta=\{H_1, H_2, \ldots, H_l, \ldots, H_N, H_\Theta\}$ of the identification framework, the final diagnosis result may be written as $\{\beta_1, \delta_2, \ldots, \beta_l, \ldots, \beta_N, \beta_\Theta\}$, where $\beta_\Theta$ represents a degree of uncertainty.

Furthermore, in the Step S7, by adjusting the identification framework, the Step S1 is returned for further diagnosis and positioning, thereby reducing complexity. In general, sequential identification according different levels such as health status, fault type, and fault location, in accordance with actual requirements. When there is no need to judge the fault type, then identification is performed according to the health status and the fault location.

The disclosure is described in detail below with reference to specific examples. The disclosure is not only applicable to fault diagnosis of sweep frequency response analysis of a transformer winding, but may also be extended to other device diagnosis fields.

The flowchart is shown in FIG. 1. According to the Step S1, test fingerprint data $\overline{X}_1$, historical fault data $\overline{X}_2$, simulation test data $\overline{X}_3$, and simulation data $\overline{X}_4$ and $\overline{X}_5$ of the transformer FRA are first loaded. In the embodiment, it is known that there is a fault, therefore the first stage of diagnosis is skipped and fault diagnosis is directly performed. Then data to be tested $\overline{X}_0$ of the transformer FRA is loaded. The identification framework is set as $\Theta=\{$winding short circuit $H_1$, longitudinal deformation $H_2$, axial deformation $H_3$, uncertainty $H_\Theta\}$. The loaded data is sorted according to information such as type and label, as shown in Table 1.

TABLE 1

Overview of data loaded

| Data number | Data Source | Identification framework | Whether to select data |
|---|---|---|---|
| $\overline{X}_0$ | Data to be tested | $\Theta$ | √ |
| $\overline{X}_1$ | Fingerprint data | healthy | × |
| $\overline{X}_2$ | Historical fault data | $H_1$ | √ |
| $\overline{X}_3$ | Simulation test data | $H_2$ | √ |
| $\overline{X}_4$ | Simulation data | $H_2$ | × |
| $\overline{X}_5$ | Simulation data | $H_3$ | √ |

The data $\overline{X}_1$ in the above table is fingerprint data in a healthy state. The identification framework here does not include the healthy state, therefore it is excluded. For the same label, the data with low reliability may be eliminated according to the data source. Labels of the data $\overline{X}_4$ and $\overline{X}_3$ are the same, therefore the simulation test data $\overline{X}_3$ with higher reliability is retained, while the simulation data $\overline{X}_4$ with lower reliability is deleted.

Figure 2:
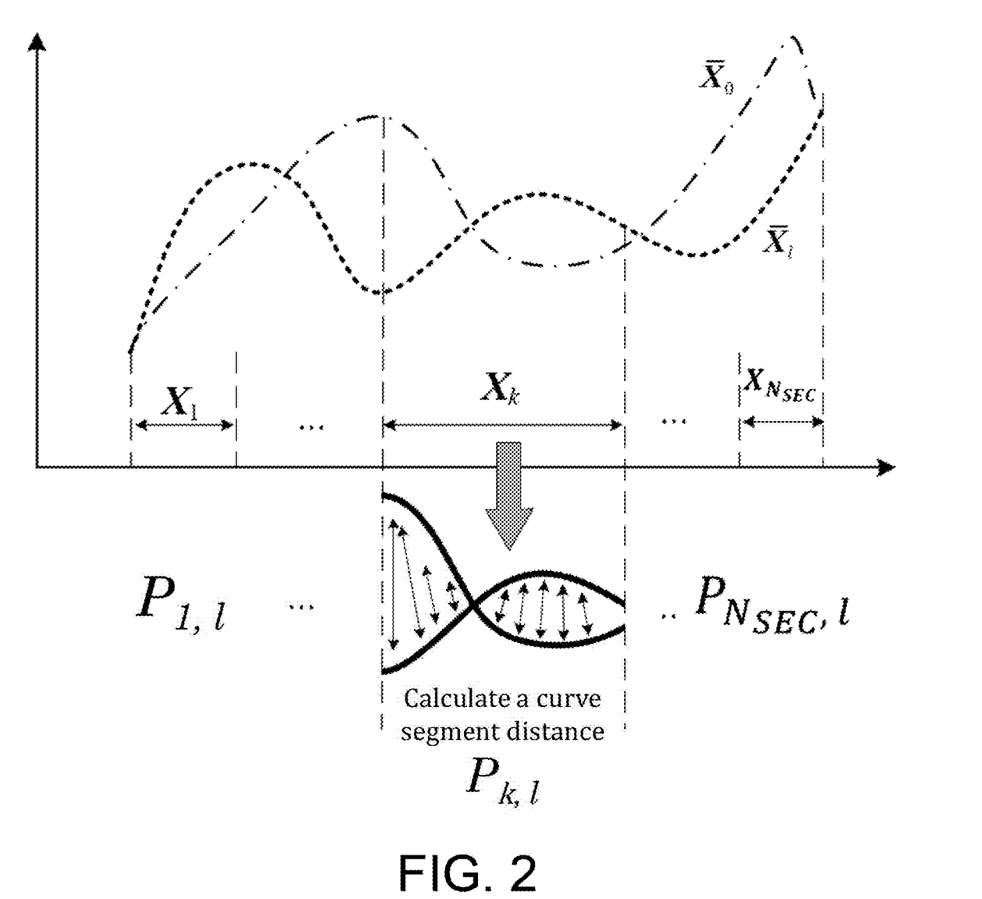
FIG. 2 is a schematic diagram of a curve segmentation and distance calculation method provided by an embodiment of the disclosure.

Then according to the Step S3, the basic probability assignment is calculated, and the reliability decision matrix is constructed. First, a curve to be diagnosed $\overline{X}_0$ and comparison curves $\overline{X}_2$, $\overline{X}_3$, and $\overline{X}_5$ are divided into 7 segments, as shown in FIG. 2, in which $N_{SEC}=7$, $\overline{X}=[X_1, X_2, \ldots, X_k, X_7]$, where $k=1, 2, \ldots, 7$. Then, the distance $P_{k,l}$ between $\overline{X}_0$ and respectively each segment of $\overline{X}_2$, $\overline{X}_3$, and $\overline{X}_5$ through the Euclidean distance, and the calculation formula is $$P_{k,l}(X_{k,l}, Y_{k,l}) = \sqrt{\Sigma(x_{k,l,i} - y_{k,l,i})^2}$$

Where $x_i$ and $y_i$ respectively represent any point on line segments X and Y

The curve distance is converted to the reliability $$\beta_{k,l} : \beta_{k,l} = (P_{k,l})^{-1} / \sum_{l=1}^{N} (P_{k,l})^{-1},$$

and normalized at the same time.

Then, the reliability decision matrix is calculated: $D_g=(S(X_k))P_{N_{SEC} \times N}$, the results are shown in Table 2.

TABLE 2

Fault diagnosis reliability decision matrix of the transformer FRA

| Curve segment | Identification framework ($\Theta$ = {winding short circuit $H_1$, longitudinal deformation $H_2$, axial deformation $H_3$, uncertainty $H_\Theta$ }) | | | |
|---|---|---|---|---|
| | $H_1$ | $H_2$ | $H_3$ | $H_\Theta$ |
| X1 | 0.125 | 0.112 | 0.660 | 0.103 |
| X2 | 0.085 | 0.221 | 0.538 | 0.156 |
| X3 | * | * | * | * |
| X4 | 0.083 | 0.156 | 0.456 | 0.305 |
| X5 | 0.212 | 0.112 | 0.461 | 0.215 |
| X6 | 0.273 | 0.356 | 0.246 | 0.125 |
| X7 | 0.113 | 0.125 | 0.557 | 0.205 |

Note:
"*" represents an uncertainty amount, an uncertainty result that may be due to missing or damaged data, which probability is equal assignment.

In the embodiment, focus has to be on the fault type ($H_1$) of winding short circuit. Therefore, the induction vector may be defined through the reliability value $\{\beta_{k,1}\}$ in a $H_1$ column of the reliability decision matrix, that is, the induction vector $u=(u_1, u_2, \ldots, u_k, \ldots, u_{N_{SEC}})$, $$u_k = \frac{\beta_{k,1}}{\sum_{k=1}^{7} \beta_{k,1}}.$$

Thereby, obtaining an induction vector $u=(u_1, u_2, \ldots, u_k, \ldots, u_{N_{SEC}}) = (10.95\%, 7.45\%, 21.91\%, 7.27\%, 18.58\%, 23.93\%, 9.9\%)$.

Then, a weight factor is calculated according to the Step S5. For different fault types, an initial weight is the same: $\omega'=(\omega'_1, \omega'_2, \ldots, \omega'_7)$, $\omega'_1=\omega'_2=\ldots=\omega'_4=\frac{1}{7}$. The induction vector remains unchanged after compounding of the induction vectors, that is $\omega=u$.

Next, the Step S6 is performed to fuse all evidence by the induced weighted evidence theory and reliability of comprehensive evaluation is calculated to obtain: $\beta_1=(19.8\%, 21.6\%, 43.0\%, 15.6\%)$. Therefore, the state of the device to be diagnosed is the fault type 3, that is, axial deformation (the identification framework $H_3$). After careful inspection of the device, it was found that the winding of the device were deformed in an axial direction, thereby demonstrating effectiveness of the method.

The disclosure also provides a computer-readable storage medium on which a computer program is stored. When the program is executed by a processor, the transformer fault diagnosis method using induced ordered weighted evidence reasoning in the method embodiment is implemented.

It should be noted that according to implementation requirements, each step/component described in the application may be split into more steps/components, or two or more steps/components or partial operations of the steps/components may be combined into new steps/components, so as to realize the purpose of the disclosure.

Although the disclosure has been described with reference to the above-mentioned embodiments, it is not intended to be exhaustive or to limit the disclosure to the precise form or to exemplary embodiments disclosed. It is apparent to one of ordinary skill in the art that modifications to the described embodiments may be made without departing from the spirit and the scope of the disclosure. Accordingly, the scope of the disclosure is defined by the claims appended hereto and their equivalents in which all terms are meant in their broadest reasonable sense unless otherwise indicated.

What is claimed is:

1. A transformer fault diagnosis method using induced ordered weighted evidence reasoning, comprising:
   loading a typical data sample of a transformer FRA, and setting a diagnostic label as an identification framework; wherein the typical data sample of the transformer FRA is detected by voltage detectors, which are connected to end terminals of a transformer;
   loading test data of a device to be diagnosed;
   calculating basic probability assignment of a detection data curve of the device to be diagnosed and all characteristic data curves in the identification framework, and constructing a reliability decision matrix;
   calculating an induced ordered weighted averaging operator and its induction vector according to a sample source of the test data of the device to be diagnosed;
   calculating an index weight vector; and
   fusing all evidence by the induced ordered weighted evidence theory and calculating reliability of comprehensive evaluation, so as to determine a diagnosis result;
   wherein calculating the basic probability assignment of the detection data curve of the device to be diagnosed and all the characteristic data curves in the identification framework comprises:
   dividing a detection data curve $\overline{X}_0$ of the device to be diagnosed and a characteristic data curve $\overline{X}_1$ in the identification framework into $N_{SEC}$ segments in a same manner, with $\overline{X}_0=[X_{01}, X_{02}, \ldots, X_{0k}, \ldots, X_{0N_{SEC}}]$, $\overline{X}_1=[X_{l1}, X_{l2}, \ldots, X_{lk}, \ldots, X_{lN_{SEC}}]$, where $X_{0k}$ represents a k-th segment after division of $\overline{X}_0$, $X_{lk}$ represents a k-th segment after division of an l-th curve $\overline{X}_1$ in the identification framework, where $k=1, 2, \ldots N_{SEC}$; wherein the identification framework comprises a plurality of fault types and uncertainty result, and the fault types comprises winding short circuit, longitudinal deformation, and axial deformation; and
   calculating a distance $P_{k,l}$ between each segment of the detection data curve of the device to be diagnosed and all the characteristic data curves in the identification framework through a curve similarity algorithm, and convert the distance of each curve into a reliability $\beta_{k,l}$.

2. The method according to claim 1, wherein the typical data sample of the transformer FRA loaded comprises:
   an actual test sample, comprising historical test data of the device or manufacturer test data, and the data sample type is a most accurate reference data;
   a sample of a device of a same model, comprising test data of another device of the same model, and the data is a more accurate reference data;
   an accurate simulation sample, comprising a sample of various labels that are obtained after a detailed simulation model is established for the device; and
   a fast simulation sample, comprising the sample of various labels that are obtained through simulation after a simplified model is established for the device while taking into consideration various limitations of hardware and timeliness.

3. A computer-readable storage medium with a computer program stored thereon, wherein the computer program realizes the steps of claim 2 when the computer program is executed by a processor.

4. The method according to claim 1, wherein setting the diagnostic label as the identification framework comprises:
   dividing data to be tested first into two types of diagnosis of healthy and unhealthy in a first stage of diagnosis, so that the identification framework is $\Theta=\{healthy, unhealthy\}$, or dividing the data to be tested into different health levels,
   wherein when the diagnosis result is that the data to be tested is in an unhealthy state and a fault type has to be further detected, at this time, a second stage of diagnosis is entered, where the fault type is $F_i$ (i=1, 2, . . . ), and the identification framework is set to $\Theta=\{F_1, F_2, \ldots, F_i, \ldots\}$,
   wherein when the diagnosis result is that the data to be tested is in the unhealthy state and a fault location has to be further detected, at this time, a third stage of diagnosis is entered, where the fault location is $L_j$ (j=1, 2, . . . ), and the identification framework is set to $\Theta=\{L_1, L_2, \ldots, L_j, \ldots\}$,
   wherein to ensure a unified description, all elements in the identification framework are marked as $\Theta=\{H_1, H_2, \ldots, H_l, \ldots, H_N\}$, where l represents number of a subset in the identification framework, and N represents number of all subsets in the identification framework.

5. A computer-readable storage medium with a computer program stored thereon, wherein the computer program realizes the steps of claim 4 when the computer program is executed by a processor.

6. The method according to claim 1, wherein constructing the reliability decision matrix comprises:
   defining a distribution assessment vector S as $S(X_k(A_t))=\{(H_l, \beta_{k,l}(A_t)), l=1, \ldots, N\}$, which means that an attribute $X_k$ of an evaluated object $A_t$ is assessed to be at a level $H_l$, with the reliability of $\beta_{l,0}$, then an evaluation result of $N_{SEC}$ basic attributes of T evaluated objects (t=1, 2, . . . , T) may be expressed as the reliability decision matrix: $D_g=(s(x_k(A_t)))_{N_{SEC}\times T}$, where $X_k$ represents a k-th segment curve corresponding to the evaluated object $A_t$ after division.

7. The method according to claim 6, wherein calculating the induced ordered weighted averaging operator and its induction vector comprises:
   determining an induced variable $u_k$ of the device to be diagnosed, and assigning values to the induced variable based on data preliminarily calculated in previous steps;
   defining an ordered weighted averaging operator F to satisfy $$F(\langle u_1, a_1\rangle, \ldots, \langle u_{N_{SEC}}, a_{N_{SEC}}\rangle) = \sum_{k=1}^{N_{SEC}} \omega_k b_k,$$

where $\omega=(\omega_1, \omega_2, \ldots, \omega_k, \ldots, \omega_{N_{SEC}})$ is a weighted vector, $$\omega_k \in [0, 1], \sum_{k=1}^{N_{SEC}} \omega_k = 1; \langle u_k, a_k\rangle$$

is called an OWA pair, $b_k$ is a k-th element in $\{u_1, u_2, \ldots, u_{N_{SEC}}\}$ when arranged in an descending order/ascending order that corresponds to a second component $a_k$ in the OWA pair, and a first component $u_k$ in $\langle u_k, a_k\rangle$ is called an induced component, and a second component $a_k$ is a numerical component,
   wherein when $u_{k1}=u_{k2}$, then $a_{k1}$ and $a_{k2}$ is divided equally during an assembly process of the OWA pair:

$$\left\langle u_{k1}, \frac{1}{2}(a_{k1}+a_{k2})\right\rangle, \left\langle u_{k2}, \frac{1}{2}(a_{k1}+a_{k2})\right\rangle,$$

where k1 and k2 represent two different values of k, $u_{k1}$ and $u_{k2}$ represent two different values of $u_k$, and $a_{k1}$ and $a_{k2}$ represent numerical components of $a_k$.

8. A computer-readable storage medium with a computer program stored thereon, wherein the computer program realizes the steps of claim 6 when the computer program is executed by a processor.

9. The method according to claim 7, wherein calculating the index weight vector comprises:
   obtaining different weights $\omega'=(\omega'_1, \omega'_2, \ldots, \omega'_k, \ldots, \omega'_{N_{SEC}})$ by division using equal assignment according to the attribute $X_k$, where $$\omega'_1 = \omega'_2 = \ldots = \omega'_k = \ldots = \omega'_{N_{SEC}} = \frac{1}{N_{SEC}};$$

or
   calculating respective weights $\omega'=(\omega'_1, \omega'_2, \ldots, \omega'_k, \ldots, \omega'_{N_{SEC}})$ using an objective weight assignment method, and then adjusting according to the induced component, and finally determining the weight values to be $$\begin{cases} \omega = (\omega_1, \omega_2, \cdots, \omega_k, \cdots, \omega_{N_{SEC}}) \\ \omega_k = \dfrac{\omega'_k u_k}{\sum_{k=1}^{N_{SEC}} \omega'_k u_k}, \text{ and } \sum_{k=1}^{N_{SEC}} \omega_k = 1 \end{cases},$$

where the induction vector $u=(u_1, u_2, \ldots, u_k, \ldots, u_{N_{SEC}})$, wherein when a final weight has to be optimized according to the OWA operator F, an objective function is set as $\Gamma(\omega)$, thereby obtaining $$\begin{cases} \min \Gamma(\omega) = \sum_{k=1}^{N_{SEC}} \Gamma(\omega_k) \\ \text{s.t.} \sum_{k=1}^{N_{SEC}} \omega_k = 1 \end{cases},$$

and finally obtaining the weight vector $\omega=(\omega_1, \omega_2, \ldots, \omega_k, \ldots, \omega_{N_{SEC}})$ of each attribute.

10. A computer-readable storage medium with a computer program stored thereon, wherein the computer program realizes the steps of claim 7 when the computer program is executed by a processor.

11. The method according to claim 9, wherein fusing all the evidence by the induced ordered weighted evidence theory and calculating the reliability of the comprehensive evaluation, so as to determine the diagnosis result comprises:

inputting information of the different attributes $X_k$ into the same identification framework $\Theta$, calculating the basic probability assignment m where:

$$m_{k,l} = m_k(H_l) = \omega_k \beta_{k,l}$$

$$m_{k,H_\Theta} = m_k(H_\Theta) = 1 - \sum_{l=1}^{N} m_{k,l} = 1 - \omega_k \sum_{l=1}^{N} \beta_{k,l}$$

$$\tilde{m}_{k,H_\Theta} = \tilde{m}_k(H_\Theta) = \omega_k \left(1 - \sum_{l=1}^{N} \beta_{k,l}\right)$$

$$\bar{m}_{k,H_\Theta} = \bar{m}_k(H_\Theta) = (1 - \omega_k)$$

compounding the probability assignment:

$$m_l = K \left[ \prod_{k=1}^{N_{SEC}} (m_{k,l} + \bar{m}_{k,H_\Theta} + \tilde{m}_{k,H_\Theta}) - \prod_{k=1}^{N_{SEC}} (\bar{m}_{k,H_\Theta} + \tilde{m}_{k,H_\Theta}) \right]$$

$$\tilde{m}_{H_\Theta} = K \left[ \prod_{k=1}^{N_{SEC}} (\bar{m}_{k,H_\Theta} + \tilde{m}_{k,H_\Theta}) - \prod_{k=1}^{N_{SEC}} (\bar{m}_{k,H_\Theta}) \right]$$

$$\bar{m}_{H_\Theta} = K \left[ \prod_{k=1}^{N_{SEC}} (\bar{m}_{k,H_\Theta}) \right]$$

$$K = \left[ \sum_{l=1}^{N} \prod_{k=1}^{N_{SEC}} (m_{k,l} + \bar{m}_{k,H_\Theta} + \tilde{m}_{k,H_\Theta}) - (N-1) \prod_{k=1}^{N_{SEC}} (\bar{m}_{k,H_\Theta} + \tilde{m}_{k,H_\Theta}) \right]^{-1}$$

and obtaining a comprehensive diagnosis result after normalized processing:

$$\{H_l\} : \beta_l = \frac{m_l}{1 - \bar{m}_{H_\Theta}}, l = 1, \ldots, N$$

$$\{H_\Theta\} : \beta_\Theta = \frac{\tilde{m}_{H_\Theta}}{1 - \bar{m}_{H_\Theta}}, l = 1, \ldots, N$$

wherein for each state $\Theta=\{H_1, H_2, \ldots, H_l, \ldots, H_N, H_\Theta\}$ of the identification framework, the final diagnosis result is: $\{\beta_1, \beta_2, \ldots, \beta_l, \ldots, \beta_N, \beta_\Theta\}$, where $\beta_\Theta$ represents a degree of uncertainty.

12. A computer-readable storage medium with a computer program stored thereon, wherein the computer program realizes the steps of claim 9 when the computer program is executed by a processor.

13. A computer-readable storage medium with a computer program stored thereon, wherein the computer program realizes the steps of claim 11 when the computer program is executed by a processor.

14. A computer-readable storage medium with a computer program stored thereon, wherein the computer program realizes the steps of claim 1 when the computer program is executed by a processor.

15. A transformer fault diagnosis system using induced ordered weighted evidence reasoning, comprising a processor, wherein the processor is configured to:

load typical data samples of a transformer FRA and set a diagnostic label as an identification framework; wherein the typical data sample of the transformer FRA is detected by voltage detectors, which are connected to end terminals of a transformer;

load test data of a device to be diagnosed;

calculate basic probability assignments of a detection data curve of the device to be diagnosed and all characteristic data curves in the identification framework, and construct a reliability decision matrix;

calculate an induced ordered weighted averaging operator and its induction vector according to a sample source of the test data of the device to be diagnosed;

calculate an index weight vector; and fuse all evidence by the induced ordered weighted evidence theory and calculate reliability of comprehensive evaluation, so as to determine a diagnosis result;

wherein the processor is further configured to:

divide a detection data curve $\bar{X}_0$ of the device to be diagnosed and a characteristic data curve $\bar{X}_l$ in the identification framework into $N_{SEC}$ segments in a same manner, with $\bar{X}_0=[X_{01}, X_{02}, \ldots, X_{0k}, \ldots, X_{0N_{SEC}}]$, $\bar{X}=[X_{l1}, X_{l2}, \ldots, X_{lk}, \ldots, X_{lN_{SEC}}]$, where $X_{0k}$ represents a k-th segment after division of $\bar{X}_0$, $X_{lk}$ represents a k-th segment after division of an l-th curve $\bar{X}_l$ in the identification framework, where $k=1, 2, \ldots N_{SEC}$; wherein the identification framework comprises a plurality of fault types and uncertainty result, and the fault types comprises winding short circuit, longitudinal deformation, and axial deformation; and calculate a distance $P_{k,l}$ between each segment of the detection data curve of the device to be diagnosed and all the characteristic data curves in the identification framework through a curve similarity algorithm, and convert the distance of each curve into a reliability $\beta_{k,l}$.

\* \* \* \* \*